United States Patent [19]

McMinn

[11] Patent Number: 4,725,775
[45] Date of Patent: Feb. 16, 1988

[54] RESISTOR ISOLATED BURN-IN SOCKET BOARD

[75] Inventor: Tommy E. McMinn, Dallas, Tex.

[73] Assignee: Environmental Processing, Incorporated, Richardson, Tex.

[21] Appl. No.: 873,530

[22] Filed: Jun. 12, 1986

[51] Int. Cl.$^4$ .................. G01R 31/02; H05K 1/18
[52] U.S. Cl. .................. 324/158 F; 324/73 PC; 439/525; 439/620
[58] Field of Search .......... 324/158 F, 73 PC, 158 P; 339/17 CF; 439/68–73, 525, 620

[56] References Cited

U.S. PATENT DOCUMENTS

| | | | |
|---|---|---|---|
| 3,880,493 | 4/1975 | Lockhart, Jr. | 339/17 CF |
| 4,326,765 | 4/1982 | Brancaleone | 339/17 CF |
| 4,405,188 | 9/1983 | Schwartz | 339/17 CF |
| 4,428,633 | 1/1984 | Lundergan et al. | 339/17 CF |
| 4,478,476 | 10/1984 | Jones | 339/17 CF |

OTHER PUBLICATIONS

Dougherty, R. A.; "DIP Switch Isolates Faults In System; Electronics; May 15, 1975; p. 112.

Primary Examiner—Ernest F. Karlsen
Attorney, Agent, or Firm—Hubbard, Thurman, Turner & Tucker

[57] ABSTRACT

An improved semiconductor burn-in socket assembly board test device includes a plurality of sockets having apertures formed in the cavity bottoms, spring clip type female connectors rigidly mounted in the socket cavities for engaging male connector pins of semiconductor devices (dual-in-line packages, for example), and male connector pins depending from the cavity bottoms. Cermet resistors are rigidly fixed within the cavity bottom apertures, and soldered to the female and male connectors whereby a semiconductor burn-in test board is provided having isolation resistors vertically disposed with respect to the socket's female and male connectors and within the thickness of the socket bottoms.

11 Claims, 5 Drawing Figures

RESISTOR ISOLATED BURN-IN SOCKET BOARD

BACKGROUND OF THE INVENTION

This invention relates to test equipment for semiconductor devices and more particularly to an improvde semiconductor burn-in socket assembly board test device.

In the past, semiconductor circuits were tested by "burn-in" on parallel pin boards. More recently, however, United States Government specifications (Mil. 883C), required that all burn-in boards have resistor isolation for reducing output and input interference between adjacent semiconductor devices being tested by burn-in.

Resistor isolation has been accomplished by laying several quarter-watt resistors (for example) along the sides of the sockets one for each pin. Each resistor used in this procedure occupies about 0.4 inches space when used in the horizontal position. To conserve some of this space, the resistor's have been used in a stand-up (hair pin like) position. When used in this fashion, horizontal space is preserved at the expense of increasing the vertical height. The disadvantage attending the use of stand-up resistors, is that they can be bent and bending causes the cracking of their bodies and shorts.

An example of a prior art burn-in socket having resistors attached to the contacts of the sockets with the resistors brought to the outside of the socket and secured to holes of the circuit board is the dual-in line package (DIP) burn-in socket disclosed in U.S. Pat. No. 4,478,476.

Another example of a prior art burn-in socket assembly for multi-pin integrated circuits (DIPs) includes a resistor located in a recess along a longitudinal axis of the socket assembly. In this arrangement, described in more detail in U.S. Pat. No. 4,428,633, the resistor is inserted directly into a socket housing with resistor body positioned into a longitudinal cavity. The resistor leads are gripped by walls of slots formed in the conductive material in contact with a tab connected to the printed circuit board.

In another electronic device, constituting the subject matter of U.S. Pat. No. 4,326,765, a carrier receives the leads of inserted integrated circuit devices and connects to a printed wiring circuit board. A recessed area of the carrier is provided for a resistor. Contact between the resistors and the circuit board pins is provided by arcurate spring members positioned within the body of the carrier. The pin members of the leads of the integrated circuit bias against the arcurate spring and extend into a socket contact electrically connected to the circuit board.

SUMMARY OF THE INVENTION

Accordingly, it is an object of this invention to provide an improved semiconductor burn-in socket assembly.

Another object of the invention is to provide an improved resistor isolated semiconductor burn-in socket assembly having substantially the same socket density and size as the original parallel pin boards.

Still another object of the invention is to provide an improved resistor isolated semiconductor burn-in socket assembly having a resistor protected from bending and body cracking forces.

Briefly stated the improved resistor isolated burn-in socket assembly constituting the subject matter of this invention comprises a socket assembly for multi-pin integrated circuit testing wherein each socket includes an isolation resistor vertically disposed in the socket's base between a multi-pin integrated circuit pin receiving clip and a contact pin.

BRIEF DESCRIPTION OF THE DRAWINGS

Other objects and features of the invention will become more readily understood from the following detailed descriptio and appended claims when read in conjunction with the accompanying drawings in which:

Referring now to FIG. 1, the prior art socket 10 of the parallel pin board 12 includes a two element 14 and 16 spring clip mounted in socket 10. Spring element 14 is a strip of a suitable conductive material. The element has a shape substantially as shown in the FIG. 1. That is, the contact 14 has one end (upper) rigidly attached to the open end socket wall of the board 12. From the attached end, the spring extends downwardly and inwardly to a first bend centrally located within the socket, then downwardly and outwardly to a second bend located adjacent to the socket wall, and then to and vertically through an aperture centrally located with respect to the socket to form a pigtail contact 18 for connection to a supporting burn-in board.

The spring element 16, except for the pigtail contact, which it doesn't have, is the mirror image of spring element 14. Thus, the first bend of spring element 16 corresponds to the first bend of spring element 14 to form a spring clip type electrical contact for frictionally engaging a pin of a multipin semiconductor package, for example, for retention.

Figure 1:
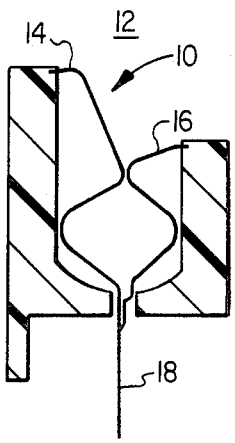
FIG. 1 is a partial cross-sectional view of a prior art parallel pin board showing the details of a socket.
Figure 2:
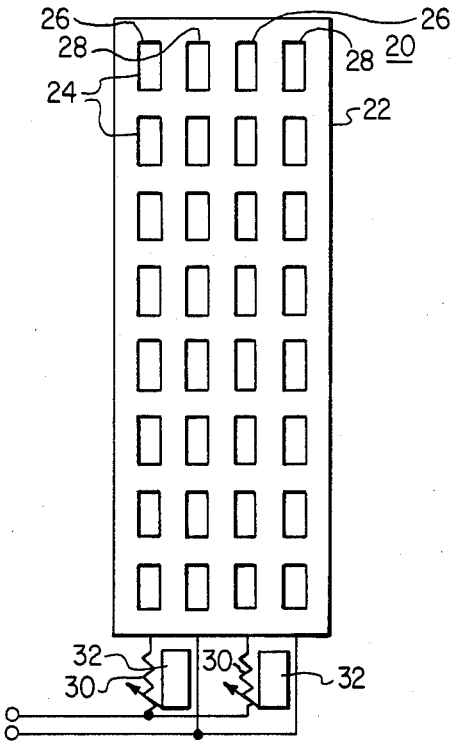
FIG. 2 is a plan view of the burn-in board.

Referring now to FIG. 2, a supporting burn-in board 20 includes a substrate 22 having a plurality of female connectors 24 arranged in rows and columns. The supporting board has alternative columns 26 and 28 of the connectors connected to input and output circuits. The input circuits include the contacts of columns 26 connected to variable resistors 30 for connection to a source of power and resistor control means 32 for selecting the values of the resistors; the output circuits include the contacts of columns 28 connected to return leads to selected electrical parameter measuring instruments.

Figure 3:
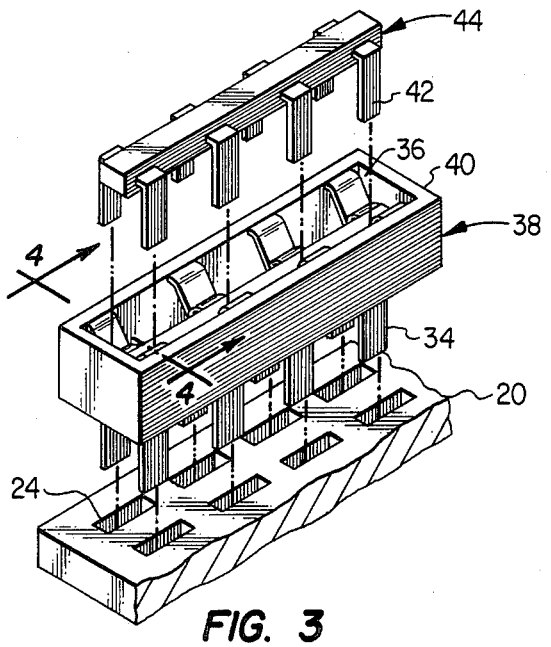
FIG. 3 is an exploded isometric view of the burn-in board, socket assembly housing and a dual-in-line integrated circuit package (DIP).

Referring now to FIG. 3, the supporting burn-in board 20 is positioned with its female connectors ready to receive male connectors 34 of sockets 36 of a socket assembly board 38. The sockets 36 of the socket assembly are arranged in a housing 40 to correspond to the male connectors 42 of the device 44 to be tested. The overall dimensions of the housing 40 are those of the prior art parallel pin board. The housing 40 may be of any suitable insulating material such as, for example, ceramic or a thermal setting plastic. The device 44 shown in FIG. 3 is a dual-in-line package (DIP) containing integrated circuits ready for testing.

The socket 36 (FIG. 4) is formed in the housing 40. The dimensions of the socket walls 46 and 48 and bottom 50 are those of the prior art parallel pin board. The bottom walls 50 form an aperture for an isolation resistor 52 (FIGS. 4 and 5), hereinafter described.

The resistor 52 is held in position in the bottom aperture by a spring contact member 54 fixed to a first end of the resistor 52 and by a contact 56 connected to a second end of the resistor.

Figure 4:
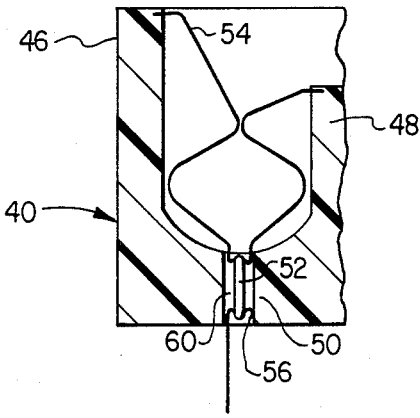
FIG. 4 is a partial, cross-sectional view taken along lines A—A of FIG. 3 showing the details of a socket of the resistor isolated burn-in socket assembly of the present invention.
Figure 5:
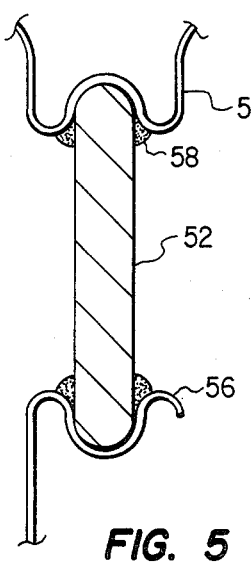
FIG. 5 is an enlarged partial, cross-sectional view taken along lines A—A of FIG. 4 showing the details of the clip and pin connections to the isolation resistor.

Spring contact 54 is a strip of suitable spring type material coated with, for example, beryllium copper or a phosphor bronze spring. The spring contact 54 has first and second ends rigidly attached to walls 46 and 48 and is shaped as shown in FIG. 4. That is, the strip is U-shaped with neck forming legs forming a clip type contact for male connectors of semiconductor devices to be tested, and the bottom or leg connecting member is contoured to fit the first end of resistor 52. While the contact 56 is a strip of electrically conductive material having a vertical portion forming a male connector and a horizontal portion that is integral with the vertical portion and contoured to fit the second end of the isolation resistor 52. The first and second ends of the isolation resistor 52 are soldered to the corresponding contours of the spring contacts 54 and contact 56.

The isolation resistor 52 (FIGS. 4 and 5) is, for example, a cermet resistor having, for example, a 50 mil width and a 100 mil length. A cermet resistor is a metal glaze resistor, consisting of a mixture of finely powdered precious metals and insulating materials fired onto a ceramic substrate. The first and second ends of the resistor are coated with solder 58 forming mounting terminations. That is, with the sockets assembled with the solder ends fitted into the contours of the contact members 54 and 56, and a glass powder filled binder filling the space between the resistor and aperture walls, the socket assembly is heated to flow the solder and form a glass frit 60 (FIG. 4). Thus, the glass frit secures the resistor to the housing 40 and with the resistor soldered to the contacts a one piece element is formed having the isolation resistor between the contacts.

It will be apparent to one skilled in the art that with the isolation resistor having a length less than or equal to the thickness of the prior art socket's bottom, a socket assembly is provided whose dimensions are compatible with existing associated equipment.

Although only a single embodiment of the invention has been described it will be apparent to a person skilled in the art that various modifications to the details of construction shown and described may be made without departing from the scope of the invention.

What is claimed is:

1. An imporved testing apparatus for semiconductor devices comprising:
   (a) a housing having side walls and a bottom, said side walls and bottom having preselected dimensions, the side walls coacting with the bottom for forming a plurality of socket wells, and the bottom having a plurality of apertures forming bottom passages into the socket wells;
   (b) a plurality of female connector means mounted in the socket wells for receiving connecting pins of a semiconductor device to be tested;
   (c) a plurality of resistors, said resistors mounted in the apertures forming bottom passages into the socket wells, said resistors having first and second ends, the first ends being connected to the female connector means and the second ends terminating within the apertured bottom; and
   (d) a plurality of male connector means, said male connector means having ends connected to corresponding second ends of the resistors, and body portions extending externally of the bottom for connection to a burn-in board, whereby th testing apparatus is adapted for use in existing burn-in equipment.

2. An improved testing apparatus according to claim 1 wherein, the housing is made of a non-conductive material taken from the group consisting of ceramics and thermal setting plastics.

3. An improved testing apparatus according to claim 1 wherein, each female connector of the plurality of female connector means includes a strip of conductively coated resilient material having a shape substantially that of FIG. 4.

4. An improved testing apparatus according to claim 1 wherein each female connector of the plurality of female connector means includes a strip of resilient conductor material having first and second ends fixed adjacent to the tops of socket well forming walls and extending into the cavity of the socket to form a spring type clip intermediate to the top and bottom of the socket and a resistor connecting terminal adjacent to the bottom of the socket.

5. An improved testing apparatus according to claim 4, wherein the resistor connecting terminal of the female connector has a contour corresponding to that of an end of the resistor to be connected thereto.

6. An improved testing apparatus according to claim 1 wherein eachmale connector of the plurality of male connector means includes a strip of conductive material having an end contour corresponding to that of an end of the resistor to be connected thereto.

7. An improved testing apparatus according to claim 1 wherein each resistor of the plurality of resistors has solder type terminal ends for solder connection to the female and male connectors.

8. An improved testing apparatus according to claim 1 wherein glass frits are used to rigidly mount the plurality of resistors in the apertures of the plurality of apertures forming bottom passages into the socket wells.

9. An improved testing apparatus according to claim 1 wherein the plurality of resistors are cermet resistors.

10. An improved testing apparatus for semiconductor devices comprising:
   (a) a burn-in support means having a plurality of female connectors; and
   (b) a resistor isolated test board including a socket assembly means having walls and bottoms forming a plurality of sockets, a plurality of female connectors mounted within the plurality of sockets, a plurality of resistors rigidly mounted within the bottoms of the sockets, said resistors having first and second ends, the first ends connected to the plurality of female connectors, and a plurality of male connectors connected to the second ends of the plurality of resistors, said plurality of male connectors depending from the socket bottoms and corresponding to the plurality of female connectors of the burn-in support members for connection thereto, whereby an improved testing apparatus for semiconductor devices is provided.

11. An improved testing apparatus according to claim 10, wherein the burn-in support means includes a variable resistor means connected to the plurality of female connectors and a resistance selector means connected to the variable resistor means whereby when the variable resistance means is connected to a source of power, selected resistances are connected to the plurality of female connectors.

* * * * *